United States Patent
Quick

(10) Patent No.: US 6,670,693 B1
(45) Date of Patent: Dec. 30, 2003

(54) LASER SYNTHESIZED WIDE-BANDGAP SEMICONDUCTOR ELECTRONIC DEVICES AND CIRCUITS

(76) Inventor: Nathaniel R. Quick, 894 Silverado Ct., Lake Murray, FL (US) 32746

( * ) Notice: Subject to any disclaimer, the term of this patent is extended or adjusted under 35 U.S.C. 154(b) by 0 days.

(21) Appl. No.: 09/921,545

(22) Filed: Aug. 3, 2001

(65) Prior Publication Data

(65) Related U.S. Application Data

(63) Continuation-in-part of application No. 09/088,044, filed on Jun. 1, 1998, now Pat. No. 6,271,576, which is a continuation-in-part of application No. 08/759,235, filed on Dec. 5, 1996, now Pat. No. 5,837,607.

(51) Int. Cl.[7] .............................................. H01L 27/102
(52) U.S. Cl. ............................ 257/588; 257/49; 257/77
(58) Field of Search ........................... 257/588, 49, 77, 257/51, 66, 70, 76

(56) References Cited

U.S. PATENT DOCUMENTS

| | | |
|---|---|---|
| 3,214,315 A | 10/1965 | Hildebrand |
| 3,396,401 A | 8/1968 | Nonomura |

(List continued on next page.)

OTHER PUBLICATIONS

K. G. Kreider, D.R.F. Burgess, Jr., M.J. Tarlov, G. Gillen and W. Wight, R. Lareau and L. M. Casas, "Laser Transformed SiC Thin Films," Materials Research Symposium Proceedings, vol. 339.

D.K. Sengupta, N. R. Quick and A. Kar, "Laser Direct Write of Conducting and Insulating Tracks in Silicone Carbide," Materials Research Society Symposium Proceedings, vol. 624.

D.K. Sengupta, N. R. Quick and A. Kar, "Laser Synthesis of Ohmic Contacts in Silicone Carbide Having Schottky Diode Characteristics Before Laser Treatment".

D.K. Sengupta, N. R. Quick and A. Kar, "Laser Conversion of Electrical Properties for Silicon Carbide Device Applications," Journal of Laser Applications. p. 26, vol. 13, No. 1. Feb. 2001.

Nathaniel R. Quick, "Laser Synthesis of Conductive Phases in Silicone Carbide and Aluminum Nitride," The Minerals, Metals & Materials Society, 1995.

Primary Examiner—Long Pham
(74) Attorney, Agent, or Firm—Frijouf, Rust & Pyle, P.A.

(57) ABSTRACT

A laser apparatus and methods are disclosed for synthesizing areas of wide-bandgap semi-conductor substrates or thin films, including wide-bandgap semiconductors such as silicon carbide, aluminum nitride, gallium nitride and diamond to produce electronic devices and circuits such as integral electronic circuit and components thereof.

11 Claims, 3 Drawing Sheets

U.S. PATENT DOCUMENTS

| | | | |
|---|---|---|---|
| 3,419,321 A | 12/1968 | Barber et al. | |
| 3,874,240 A | 4/1975 | Rembaum | |
| 3,945,318 A | 3/1976 | Landsman | |
| 4,159,414 A | 6/1979 | Suh et al. | |
| 4,309,224 A | 1/1982 | Shibata | |
| 4,339,285 A | 7/1982 | Pankove | |
| 4,372,989 A | 2/1983 | Menzel | |
| 4,496,607 A | 1/1985 | Mathias | |
| 4,539,251 A | 9/1985 | Sugisawa et al. | |
| 4,565,712 A | 1/1986 | Noguchi et al. | |
| 4,620,264 A | 10/1986 | Ushifusa et al. | |
| 4,624,934 A | 11/1986 | Kokubu et al. | |
| 4,663,826 A | 5/1987 | Bauerle | |
| 4,761,339 A | 8/1988 | Komatsu et al. | |
| 4,791,239 A | 12/1988 | Sirahata et al. | |
| 4,840,853 A | 6/1989 | Iio et al. | |
| 4,847,138 A | 7/1989 | Boylan et al. | |
| 4,860,442 A | 8/1989 | Ainsworth et al. | |
| 4,880,770 A | 11/1989 | Mir et al. | |
| 4,912,087 A | 3/1990 | Aslam et al. | |
| 4,924,033 A | 5/1990 | Iyogi et al. | |
| 4,950,558 A | 8/1990 | Sarin | |
| 4,988,564 A | 1/1991 | D'Angelo et al. | |
| 5,015,618 A | 5/1991 | Levinson | |
| 5,055,967 A | 10/1991 | Sukonnik et al. | |
| 5,145,741 A | 9/1992 | Quick | |
| 5,180,440 A | 1/1993 | Siegel et al. | |
| 5,391,841 A | 2/1995 | Quick | |
| 5,459,098 A | 10/1995 | Maya | |
| 5,493,096 A | 2/1996 | Koh | |
| 5,629,532 A | 5/1997 | Myrick | |
| 5,695,828 A | 12/1997 | Ghosh et al. | |
| 5,733,609 A | 3/1998 | Wang | |
| 5,837,607 A * | 11/1998 | Quick | 438/667 |
| 5,847,418 A | 12/1998 | Nakamura et al. | |
| 5,889,234 A | 3/1999 | Ghosh et al. | |
| 6,025,609 A * | 2/2000 | Quick | 257/77 |
| 6,054,375 A | 4/2000 | Quick | |
| 6,255,671 B1 | 7/2001 | Bojarczuk, Jr. et al. | |
| 6,271,576 B1 * | 8/2001 | Quick | 257/588 |

\* cited by examiner

LASER SYNTHESIZED WIDE-BANDGAP SEMICONDUCTOR ELECTRONIC DEVICES AND CIRCUITS

CROSS-REFERENCE TO RELATED APPLICATIONS

This is a continuation-in-part of U.S. patent application Ser. No. 09/088,044 filed Jun. 1, 1998 U.S. Pat. No. 6,271,576. U.S. patent application Ser. No. 09/088,044 filed Jun. 1, 1998 is a continuation-in-part of U.S. patent application Ser. No. 08/759,235 filed Dec. 5, 1996 now U.S. Pat. No. 5,837,607. All subject matter set forth in application Ser. No. 09/088,044 filed Jun. 1, 1998 and application Ser. No. 08/759,235 filed Dec. 5, 1996 is hereby incorporated by reference into the present application as if fully set forth herein.

BACKGROUND OF THE INVENTION

1. Field of the Invention

This invention relates to semiconductor electronic devices and circuits such as integral electronic circuitry and more particularly to an improved apparatus and method for creating wide-bandgap semiconductor electronic devices and circuits with laser radiation.

2. Background of the Invention

Certain ceramics, such as silicon carbide (SiC) and aluminum nitride (AlN), are known to exhibit electrical properties ranging from insulating to semiconducting to conducting, as discussed in U.S. Pat. No. 5,145,741 issued Sep. 8, 1992, entitled "Converting Ceramic Materials to Electrical Conductors and Semiconductors" issued to Nathaniel R. Quick, and U.S. Pat. No. 5,391,841 issued Feb. 21, 1995, entitled "Laser Processed Coatings on Electronic Circuit Substrates" issued to Nathaniel R. Quick. The wide-bandgap semiconductor phases of these ceramics and other wide-bandgap semiconductors including diamond, are used to create devices such as conductive tabs, interconnects, vias, wiring patterns, resistors, capacitors, semiconductor devices and the like electronic components by laser synthesis on the surfaces and within the body of such wide-bandgap semiconductor to thereby eliminate photolithography processes which require numerous steps and generate undesirable chemical pollutants when processing such traditional electronic devices, components and circuitry.

As is well known alumina ($Al_2O_3$) dominates the dielectric market as an integrating substrate or device carrier in electronics packaging. BN, AlN, SiC and diamond are also of interest, due to their Thermal Coefficient of Expansion (TCE) and for their dielectric constant and higher thermal conductivity than that of $Al_2O_3$. SiC, AlN, BN, GaN and diamond also exhibit a wide-band gap and chemical resistance; they exhibit semiconducting to insulating properties. These properties are of substantial interest for new high temperature, approaching 1000° C. and aggressive environment applications, particularly where high integrated circuit packing densities are required. In the prior art, metallization methods, including dry-film imaging and screen printing have been used for the production of conductive patterns on alumina, however, metal compatibility with the newer high thermal conductivity ceramic materials such as AlN and SiC, have not completely solved. Copper and silver paste exhibits a TCE mismatch aggravated by high temperatures as well as being subject to oxidation that increases their resistivity. In particular, bonding of copper to AlN has proved to be nontrivial alumina or stoichiometric aluminum oxynitride it (AlON) coatings must be developed on the AlN surface through passivation processes. These passivation processes have poor reproducibility. Thus, the direct laser synthesis of conductors in AlN, SiC and diamond substrates appears to provide solutions to this long standing prior art problem with regard to metallization and for more simple processing techniques for creating devices and circuitry that are compatible with selected ceramic substrates, while satisfying the need for higher temperature, aggressive environment, and higher density integrated circuit packaging applications.

SUMMARY OF THE INVENTION

The present invention is defined by the appended claims with specific embodiments being shown in the attached drawings. For the purpose of summarizing the invention, the invention relates to the use of selected wide-bandgap semiconductors including the doping of the wide-bandgap semiconductor. The invention includes the use of laser synthesis processing techniques applied to selected areas of the wide-bandgap body for creating electronic component devices. The electronic component devices may be individual component or an interconnected circuit arrangement on the surface of or within a substrate body of wide-bandgap material.

In a more specific example of the invention, the present invention includes the use of laser synthesis processing techniques applied to selected areas of the wide-bandgap semiconductor materials, chemical doping of the wide-bandgap semiconductor materials, and use of laser synthesis processing techniques applied to selected areas of the wide-bandgap semiconductor body for creating electronic component devices individually and in an interconnected circuit arrangement on the surface of and/or within a substrate body of the wide-bandgap semiconductor material, such as for examples AlN, BN, GaN, SiC and diamond, whether the wide-bandgap semiconductor is thin film or bulk material. The invention uniquely utilizes the properties of the doped wide-bandgap semiconductor in combination with selected laser synthesis techniques to create a variety of electronic devices and components, such as capacitors; resistors; diodes; transistors; logic and digital devices; electrical conductors, connection tabs, conductive holes or vias through substrates; and various types of sensors. More specifically, by selectively chemical doping designated surface areas and layers of the wide-bandgap semiconductor substrate body or film with chemical elements, a wide-bandgap semiconductor is produced that may be readily converted in designated areas thereof by laser synthesis, using one of several laser devices, to create discrete electronic devices and electronic circuit arrangements. The creation of these various electronic devices and circuits takes place incrementally, such as making a (p-n)-type carrier semiconducting device by laser synthesizing two adjacent areas, one for the (p) and the other for the (n) portion. The required electrical conductive tab connections are laser synthesized on either side of the p-n junction, to thereby form a p-n junction diode. The formation of a simple (p-n-p) or (n-p-n) arrangement is accomplished by an added step in the above diode process by adding an additional (p) or (n) laser synthesized component, with the appropriate electrical conductor connections as noted above with respect to the diode example. Such elemental electronic devices are readily produced by simple laser synthesis without the traditional multiple step processing and attendant pollution and environmental contamination problems of the prior art processes.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifing or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

The present invention focuses on the processes and materials utilized to produce circuit components such as electronic elements, components, devices and circuit interconnection insitu on monolithic wide-bandgap semiconductor compound substrate or body or of a film thereof, deposited on a support substrate. These circuit components are formed by direct conversion of selected areas of the substrate or film by laser synthesis, producing conductor, semiconductor and insulative areas insitu thereon.

In accordance with the teachings of the present invention, the apparatus and method of the present invention produces unique devices and circuitry utilizing fewer and simpler steps than required in the prior art and to eliminate many of the prior art contamination and environmental problems associated therewith.

Figure 1:
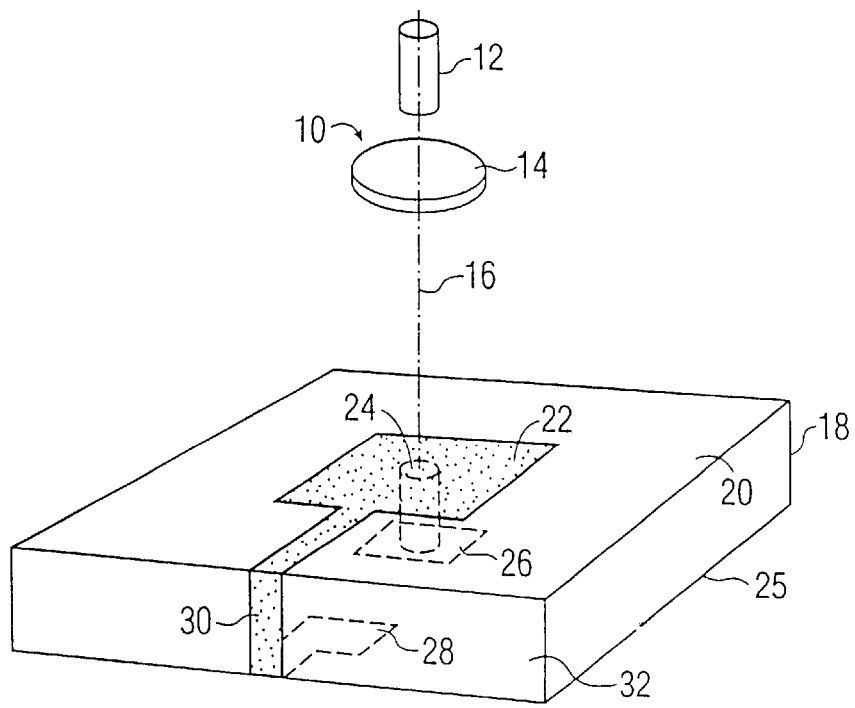
FIG. 1 shows an arrangement for practicing certain aspects of the invention, illustrating several electrical or electronic elements on a substrate that have been produced thereon by laser synthesis processing.

Referring now to the drawings, there is shown in FIG. 1, an arrangement for practicing the present invention, including a laser system 10 consisting of a laser device 12 and a laser beam focusing lens 14. A focused laser beam 16 is shown impinging upon a monolithic substrate 18 of a crystalline or polycrystalline wide-bandgap semiconductor compound material having a rectangular configuration. The top surface of substrate 18 is designated by reference 20, and has an area 22 depicted thereon that has been converted to a semiconductor material by laser beam 16 with a small circular hole or via 24 intersecting therewith that extends through substrate 18 from semiconductor 22 by laser drilling and conversion, to a surface 25 on the reverse side of substrate 18 where it terminates in a conductive connection. The terminal ends and inner exposed surface of via 24 has been converted to an electroconductor material by laser beam 16 as it drills through substrate 18 between surface 22 and 25. On the reverse side of substrate 18 on surface 25 there is depicted an area on surface 25 that has been converted to an conductor pad 26 that is formed by laser beam 16, which is connected to conductor via 24, where it terminates at surface 25. A conductor pad 26 has been formed on surface 25 by rotating substrate 18 so that surface 25 is exposed to direct laser beam 16 interaction for direct conversion of pad 26 to a conductor material in accordance with the teachings of the present invention. Continuing with the description of FIG. 1, there is shown a conductor strip 30 connected to an edge of semiconductor area 22 on surface 20 and extending therefrom to the edge of substrate 18 and thence along a substrate surface 32 and thence along surface 25, terminating thereon with an electroconductor tab 28. Both conductors 30 and tab 28 have been produced by direct laser beam 16 conversion.

Figure 2:
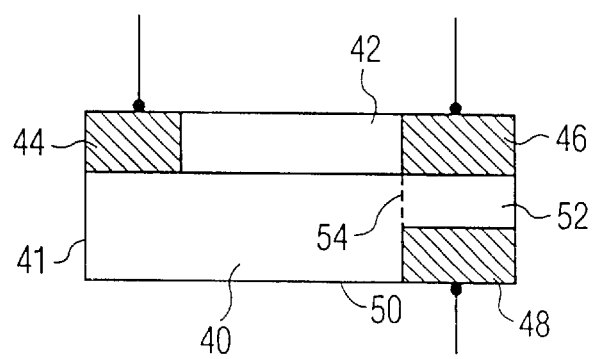
FIGS. 2–5 depict several arrangements of electronic components and elements produced on various substrates in accordance with the teachings of the present invention, illustrating how readily such elements may be disposed with respect to each other, to thereby create the devices in accordance with the present inventive teachings.
Figure 3:
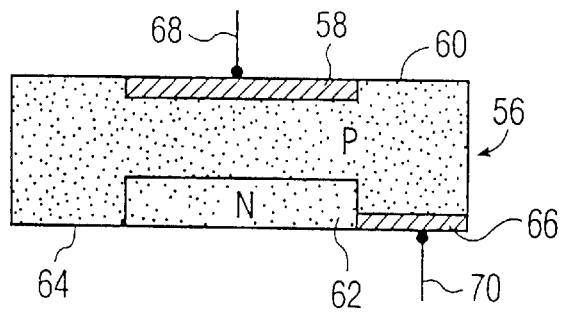
Figure 4:
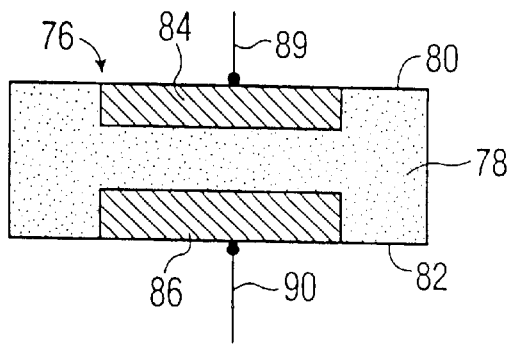

Referring now to FIGS. 2–4, there is shown a plurality of substrates that have had certain sections thereof converted directly into elements and components of electronic devices by laser beam synthesis in accordance with the teachings of the present invention. Shown in FIG. 2, is a monolithic substrate 41 of crystalline or polycrystalline wide-bandgap semiconductor compound material that is responsive to conversion by laser beam 16 exposure. More specifically, substrate 41 and a main body thereof may be a crystalline or polycrystalline widebandgap semiconductor compound material from the group including Aluminum Nitride (AlN) and Silicon Carbide (SiC) for examples, as disclosed in U.S. Pat. No. 5,145,741, dated Sep. 8, 1992, issued to applicant, the foregoing materials are known to be convertible directly by laser beam inscription, from insulative to semiconductive to resistive and to conductive materials. However, applicant knows of no prior art that has utilized such technology to produce devices such as, sensors, diodes, transistors and circuitry containing such devices insitu on selected monolithic wide-bandgap semiconductor substrates as taught by the present invention. As can readily be appreciated the present invention provides simpler processes, with fewer processing steps, fewer pieces of processing equipment and a reduction, if not the elimination, of environmental pollutants and contaminants heretofore associated with the prior art to produce such devices, as diodes, transistors, sensors and the like, as examples.

Referring again to FIG. 2, substrate body 40 is depicted as an insulative crystalline or polycrystalline wide-bandgap semiconductor compound material, such as AlN, SiC and BN, as examples. A resistor section 42 is formed on substrate body 40, having a resistive value in the range of $10^{-2}$ to $10^{-6}$ ohm-cm, a pair of electrical conductors 44 and 46 are formed on substrate 40, disposed on opposite sides of and connected to resistor section 42, to thereby produce a resistor insitu on substrate body 40. Another electrical conductor 48 is formed on the reverse side 50 of substrate body 40. As shown a portion of substrate body 40, designated 52 and delineated by a broken line 52, is disposed between electrical conductors 46 and 48, to form a capacitor.

Referring now to FIG. 3, there is shown a crystalline or polycrystalline wide-bandgap semiconductor compound substrate 56, of SiC, chemically doped with aluminum (Al) forming a p-type carrier (electron holes) semiconductor material. By laser beam synthesis, conductor 58 is formed on a surface 60 of substrate 56, and an n-type carrier (electrons) semiconductor 62 is formed at a surface 64 of substrate 56 by laser beam chemical doping with phosphorus (P), and an conductor 66 is formed on a reverse side 64 of substrate 56 and is electrically connected to n-type carrier 62.

The foregoing formed device is capable of operating as a diode in an external circuit by 20 connecting conductors 58 and 66 to external leads 68 and 70, respectively, or as an insitu diode when connected to other components which may be formed on substrate 56 and connected to terminals 58 and 66.

Referring to FIG. 4, there is shown a device 76, that may operate as various types of semiconductor devices depending on the electroresistive properties of a wide-bandgap semiconductor compound substrate body 78. There are reverse surfaces 80 and 82 on substrate body 78, that have conductors 84 and 86 formed on surfaces 80 and 82, respectively, to which external conductor terminals 88 and 90, respectively are provided for external connections.

It should be noted that devices of the type shown in FIG. 4, operate primarily on the principal of change in resistivity (ohm-cm) of the laser beam synthesized wide-bandgap semiconductor, and therefore, are uniquely adaptable to hostile environmental operations, such as with automobile and aircraft engines that a made of wide-bandgap semiconductor components. As examples, the temperature, physical changes or distortion and the presence of chemicals occurring in or near an engine, can be monitored at selected sections of the engines by depositing a film of crystalline or polycrystalline wide-bandgap semiconductor compound, directly onto the engine body at selected sections and subsequently laser beam synthesizing such films to produce a thermoresistive, piezoresistive or chemoresistive device from the deposited films. Alternately, the surface of wide-bandgap semiconductor engine components may be made of AlN, SiC or BN can be directly converted to these types of sensors. Also there are situations where the engine may have a component part made of wide-bandgap semiconductor, and it may be desirable to monitor such component and therefore, the component of the present invention may be disposed thereon and used to monitor such components. Such devices would consist of resistive areas disposed between a pair of laser synthesized conductor tabs, where the tabs are used for external connections. It has been experimentally determined that crystalline or polycrystalline wide-bandgap semiconductor compounds, such as (AlN), (SiC) and diamond, may be deposited upon wide-bandgap semiconductor materials of which automotive and aircraft engines are made, by means of known vapor or thermal spray deposition techniques, without debonding therebetween when operating at elevated temperatures of such engines. Thus, such selectively disposed devices can be used for remote monitoring of the changes in the engines readily and simply on a real time basis, when compared with the prior art techniques.

Figure 5:
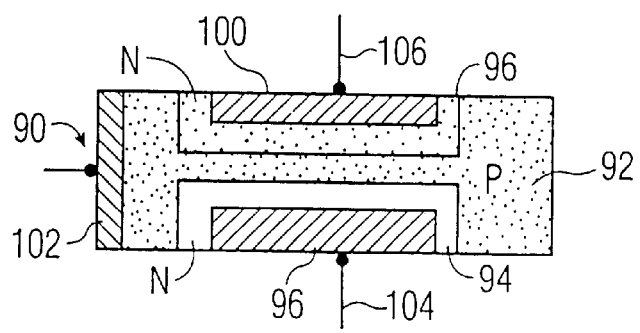

The device depicted in FIG. 5, illustrates one of several arrangements for elements for a transistor type device. There is shown a crystalline or polycrystalline wide-bandgap semiconductor substrate 90 of p-type carrier material designated 92 that has a n-type carrier section laser beam synthesized on reverse sides of the substrate designated 94 and 96. Over of these n-type carriers are conductors 98 and 100, respectively formed by laser synthesis on each layer of n-type carrier sections 94 and 96. On a surface of substrate section 92 there is formed by laser synthesis a conductor 102. Conductors 98 and 100 each have terminal conductors 104 and 106, respectively connected thereto for external connections. The device just described may be utilized as a traditional transistor connected to external circuits or as an insitu device on a monolithic substrate as part of a circuit thereon.

Figure 6:
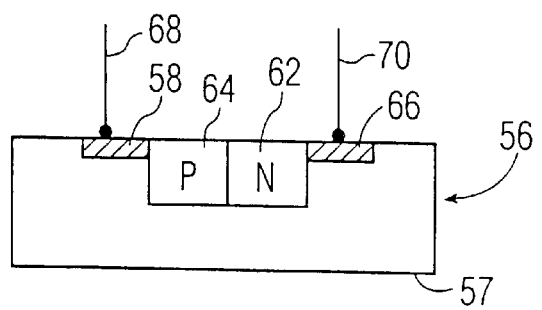
FIG. 6 depicts a p-n junction device produced in a substrate body or film with appropriate electrical conductive leads, such device may be used as a diode.

In FIG. 6, there is shown an alternate arrangement for a diode, similar to that shown in FIG. 3, where a substrate body 57 is a crystalline or polycrystalline wide-bandgap semiconductor material that is responsive to laser conversion and it has had p-type carrier and n-type carrier adjacent sections formed thereon by laser synthesis. This arrangement is the traditional configuration for junction diodes known in the prior art, and may be part of an external circuit or as a device of an insitu circuit that may be formed on a monolithic substrate in accordance with of the present invention.

Figure 7:
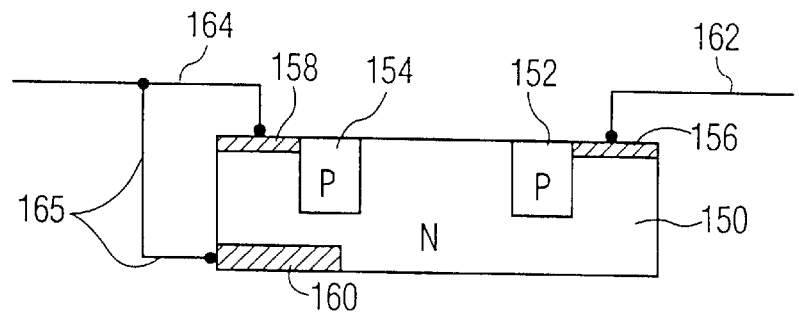
FIG. 7 depicts an n-p-n transistor device produced in accordance with the present invention.

Referring to FIG. 7, there is shown a (p-n-p)-type transistor having a configuration different from the (n-p-n)-type transistor shown in FIG. 5. As shown, there is depicted a n-type substrate 150 with two p-type carrier sections 152 and 154 separated from one another, each p-type sections has a conductor 162 and 164 connected, respectively thereto and an conductor 160 disposed on a reverse surface of substrate 150. A conductor 162 is connected to conductor 156 that function as a drain terminal of the device, while a conductor 164 is connected to conductor 158 that function as a source terminal of the device. A conductor 166 is attached to conductor 160 that is also connected to conductor 164 the source terminal. The resultant device is characterized as a traditional (p-n-p)-type transistor.

Figure 8:
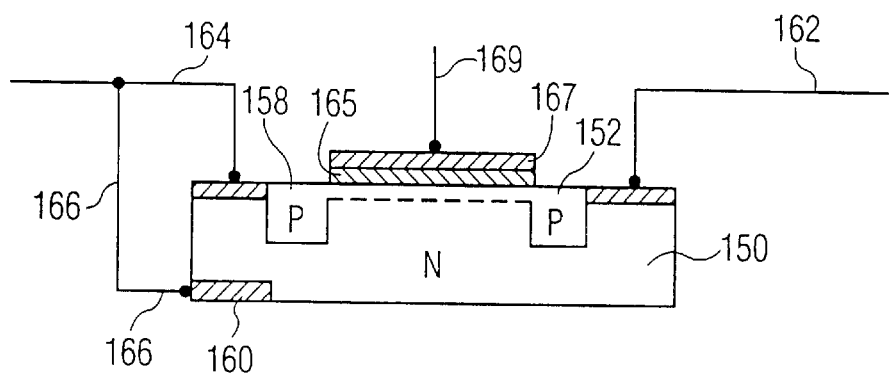
FIG. 8 depicts an n-channel transistor that is produced in accordance with the teachings of the present invention, illustrating the versatility and uniqueness of the invention.

FIG. 8 shows a device similar to the device shown in FIG. 7 with the addition of a dielectric layer 165 formed on the surface of substrate 150 and disposed between p-type carriers 152 and 158. Deposited on top of dielectric layer 165 is a conductor layer 167 to which a conductive lead 169 is attached for external connections as a gate terminal for the device. The resulting device is characterized as a n-type carrier channel transistor.

Figure 9:
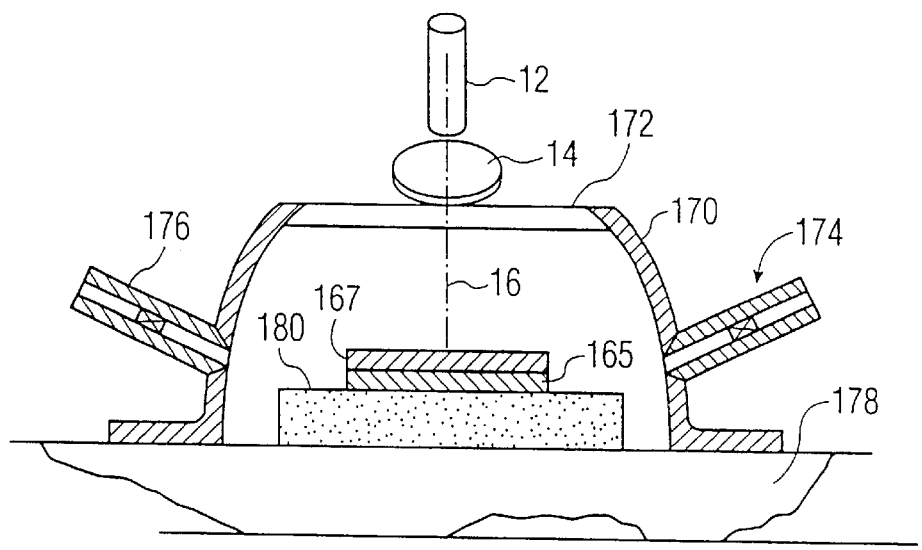
FIG. 9 depicts an air-tight chamber and laser arrangement utilized to perform certain processing steps in accordance with the invention, for producing chemical doping of entire selected wide-bandgap semiconductor substrate bodies or films and or selected areas thereof; and for selective dielectric and/or conductive coatings.

Referring now to FIG. 9, there is shown a processing arrangement including laser 12, focusing lens 14 and laser focused beam 16, such as that shown in FIG.1 and it operates in a similar manner. Also shown is a chamber 170, including an airtight laser beam transmission window 172 disposed for transmitting beam 16 therethrough into the chamber. Chamber 170 has an inlet and valve combination 174 and outlet and valve combination 176 connected to the side wall of the chamber, for injecting and removing gases into and therefrom, respectively. The chamber is dispose on a support member 178 forming an airtight seal therewith. Also shown in FIG. 9, there is a substrate 180 upon which a dielectric layer 165 is formed and a conductive layer 167 is deposited on top of dielectric layer 165. Substrate 180 is a material such as substrate 150 shown in FIGS. 7 and 8. The arrangement shown in FIG. 9, is used to convert or add to the surface of substrates placed therein. As shown, dielectric layer 165 and conductor 167 are of the type shown in FIG. 8 so as to complete the formation of an n-type carrier channel transistor.

EXAMPLE

To accomplish the unique results derived from the teachings of the present invention, it is necessary to consider some of the detail processing steps and procedures thereof. In various sections of the disclosure and claims the phrases "laser synthesis" and "laser synthesized" have been used to broadly mean or define, the use of a selected laser beam impinging (inscribing or writing or drilling) onto or into the body of a crystalline or polycrystalline substrate or body to thereby cause rapid thermal heating for melting and the rapid cooling for solidification in selected exposed areas, causing chemical and physical changes to occur to the substrate areas exposed to the laser beam. Such exposure to the laser beam may be accompanied by the use of gases, such as air, oxygen or other gas/vapor mixtures, that may be a co-operant in the process for causing such changes. Use of these phrases is consistent with the teachings of U.S. Pat. Nos. 5,145,741 and 5,391,841, noted herein and both issued to applicant.

Continuing with the disclosure of the present invention, attention is directed to the various laser devices used to perform laser synthesis as envisioned herein. The Table I entitled "Typical Laser Types", set forth below, list three (3) laser types that have been found satisfactory for practicing the present invention. A second Table II entitled "Laser Processing Parameters", shown below discloses eight (8) parameters for each of the three (3), sample laser types, namely, Nd:YAG frequency double $2\overline{\omega}$ Nd:YAG and Excimer lasers, that are useful for laser synthesis processes. These lasers are capable of laser synthesis and/or conversion of insulating and semiconducting crystalline or polycrystalline wide-bandgap semiconductors and to material combinations necessary to fabricate and produce the various electronic devices and circuits taught by the invention.

The parameters shown have been diligently arrived at after extensive test and evaluation, and have been selectively used to produce the various devices and circuits in accordance with the teachings of the present invention and claims.

TABLE I

Typical Laser Types

| Laser Types | SiC Untreated Resistivity Ohm-cm | SiC Converted Resistivity Ohm-cm |
|---|---|---|
| Nd:YAG Wavelength: 1064 nm | $10^{11}$ | $5.1 \times 10^{-3}$ |
| Excimer Wavelength: 248 nm | $10^{11}$ | $1.2 \times 10^{-3}$ |
| Frequency Double Nd:YAG Wavelength: 532 nm | $10^{11}$ | $1.9 \times 10^{-3}$ | where i=insulator greater than $10^6$
s=semiconductor $10^{-2}$ to $10^6$
c=conductor less than $10^{-2}$

TABLE II

Laser Processing Parameters

| Laser Type | Pulse energy (J) | Beam Diameter (cm) | Energy density (J/cm$^2$) | Pulse Duration (nsec) |
|---|---|---|---|---|
| Nd:YAG 1064 nm | 0.0081 | 0.025 | 12.5 | 70 |
| KrF Excimer 248 nm | 0.0034 | 0.085 | 2.2 | 30 |
| Nd:YAG 532 nm | 0.0011 | 0.002 | 339.5 | 100 |

TABLE II-continued

Laser Processing Parameters

| | Peak Pulse Intensity (W/cm) | Scan Velocity (cm/sec) | Passes | Conversion Energy (J/cm$^3$) |
|---|---|---|---|---|
| Nd:YAG 1064 nm | $1.8 \times 10^8$ | 0.3 | 2 | $1.2 \times 10^9$ |
| KrF Excimer 248 nm | $7.3 \times 10^7$ | 0.053 | 1 | $1.4 \times 10^9$ |
| Nd:YAG 532 nm | $3.4 \times 10^9$ | 2 | 1 | $1.67 \times 10^9$ |
| | | 2 | 2 | $3.35 \times 10^9$ |
| | | 40 | 1 | $8.35 \times 10^7$ |
| | | 40 | 2 | $1.67 \times 10^8$ |

TABLE III

DOPANTS AND MATERIALS GENERATED BY LASER SYNTHESIS

| DOPANT SOURCE | DOPANT | RESULTANT MATERIALS (No Oxygen Present) Aluminum Nitride | RESULTANT MATERIALS (No Oxygen Present) Silicon Carbide |
|---|---|---|---|
| Di-Borane | Boron | Boron<br>Boron Nitride(s)<br>Aluminum Boride | Boron(p-type)<br>Boron Carbide(i) |
| Silane | Silicon | Silicon(s)<br>Silicon Nitride(i) | Silicon(s)<br>Silicon Carbide(s) |
| Phosphine | Phosphorous | Phosphorous<br>Aluminum-Phosphide(s) | Phosphorous(n-type)<br>Boron |
| Titanium tetra chloride | Titanium | Titanium(c) | Titanium(s) |
| Titanium ethoxide | | Titanium nitride(c)<br>Titanium Aliminide(c) | Titanium Silicide(s)<br>Titanium Carbide |
| Aluminum sec-butoxide | Aluminum | Aluminum<br>Aluminum Nitride(s) | Aluminum(p-type)<br>Aluminum Carbide |
| Tetra Carbonyl Nickel | Nickel | Nickel<br>Nickel Aluminide(c) | Nickel(c)<br>Nickel Carbide<br>Nickel Silicide |
| Tungsten hexa-fluoride | Tungsten | Tungsten<br>Tungsten Nitride | Tungsten(c)<br>Tungsten-Carbide(c)<br>Tungsten |
| Nitrogen | Nitrogen | Nitrogen(n-type) | Nitrogen |

The wide-bandgap semiconductor materials taught by the present invention may be of a crystalline or polycrystalline structure and are representative of several hundred possible types from which to choose. For example, Silicon Carbide, in the Beta-SiC (Zineblende structure) or 6H—SiC (6 bilayers along the hexagonal crystal direction) are only two of many types of material structures SiC can have as a convertible wide-bandgap semiconductor. Similarly, many structural types exist for laser convertibility, including SiC, AlN, BN, GaN and diamond that have been the focus of the disclosure and teaching in accordance with the present invention. However, it is understood that these wide-bandgap semiconductors, may be considered preferred among others which may be selected. As can be appreciated by those skilled in this art, the practice of the present invention is strongly influenced by a working knowledge of material science and the unique properties of crystalline or polycrystalline wide-bandgap semiconductor materials known in the field of such science. Consequently, teachings herein are directed toward known factors derived from extensive experimental and proven results within such science.

Continuing, the selected wide-bandgap semiconductors, as examples, namely, SiC, AlN and diamond have been used to readily change their initial electrical: properties by "chemical doping" as by means of laser synthesis or conversion. For example, doping of Beta-SiC wide-bandgap semiconductor material with phosphorous generates n-type carrier (electrons), and with aluminum generates p-type carrier (holes) semiconductive materials. Shown herein below is Table III entitled "Dopants and Materials Generated by Laser Synthesis". As shown in Table III, materials such as, SiC and AlN as examples, may be laser synthesized with dopants, as examples, shown to produce the resultant materials. As shown, the dopants may be in the form of gases, and the chemical doping therefrom may be accomplished by the use of a system arrangement illustrated in FIG. 9 thereof. The process for doping within chamber 70 of FIG. 9, occurs by laser beam 16 irradiating the selected areas of a substrate body by inscribing or writing thereon, while simultaneously causing a gas therein to chemically disassociate and diffuse into the laser exposed areas of the substrate body to thereby cause chemical, electrical and physical changes in the properties of the substrate body where the laser has selectively scribed.

The dopants and resultant materials shown in Table III are illustrative of many combinations that could be selected within the scope of the teachings of the present invention.

From the foregoing discussions of Tables I–III, it can readily be appreciated that devices and circuits of the type taught and claimed herein can be produced by the appropriate selection of crystalline or polycrystalline wide-bandgap semiconductor material; selection of an appropriate type of laser; operating the laser with appropriate parameters; and using appropriate dopants.

Until now, the disclosure primarily has discussed the formation of the devices and circuits on substrates bodies, suggesting that the substrates are in a non-film structure. However, it is understood that the substrates envisioned by the invention includes film structures of appropriate thickness to accommodate the formation of the devices and circuits in accordance with the teachings hereof. More particularly, the substrates 44, 56, 75, 90 and 150 depicted in the various figures may be substrate films.

Various crystalline or polycrystalline wide-bandgap semiconductor materials having properties substantially identical as those of substrates 44, 56, 76, 90 and 150, and others may be readily formed on a support or carrier substrate through the use of a laser synthesis and chamber depicted in FIG. 9, for example, by means of known vapor deposition techniques.

Once a layer of film has been formed on a support substrate it may be processed in a similar manner as the substrates depicted in FIGS. 1–8, in accordance with the teachings of the invention to produce devices and integrated circuits. Successive film layers may be formed and processed to produce a multi-layer structure, that represents a unique feature for using films, to create a three dimensional structure. Conductive interconnections between selected layers, devices and circuits may be made by use of conductive vias such a via 24 depicted in and discussed in connection with FIG. 1.

The foregoing disclosure and teachings of the present invention readily and adequately demonstrate that direct laser synthesis and chemical process doping of selected wide-bandgap semiconductor substrate and film materials, can be utilized to create and produce electronic devices and circuits uniquely within the body of such wide-bandgap semiconductor materials and in which the Thermal Coefficient of Expansion (TCE) between the devices and circuits are compatible with the substrate of films owing to their inherent relationship as part of the starting material and noting that nothing during the processing of the system has changed their inherent compatibility with respect to TCE between the substrate and the circuits and devices formed thereon In addition to the enhanced TCE properties, the present invention provides electron devices and circuit arrangements within the selected wide-bandgap semiconductor materials that have better dielectric constant and higher thermal conductivity properties than those of $Al_2O_3$. which is traditionally used as support substrates for electronic devices and circuits of the type addressed by the present invention.

It is to be understood that the above described embodiments and teachings of the present invention are only illustrative of the principles applicable. Various other arrangements and processing modifications may be envisioned or refined, by those skilled in the art without departing from the spirit and scope of the invention. For example, other wide-bandgap semiconductor materials of hexagonal crystalline structure with certain nitride or carbide compounds, for examples, may be adapted to have similar or equivalent processing properties as disclosed herein, and it is inferred that like electrical semiconductive, conductive and insulative properties may be attainable within the spirit and scope of the present invention. Consequently, it is understood that the present invention is limited only by the spirit and scope of the disclosure and appended claims.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A sensor device laser synthesized directly onto a monolithic wide-bandgap semiconductor compound substrate, the combination comprising:
   a. a monolithic wide-bandgap semiconductor compound substrate responsive to laser synthesis conversion;
   b. a delineated pattern inscribed on a first surface of said substrate, having input and output ends, by a controlled focussed laser beam defining a thermoresistive sensor having resistive properties in the range of $10^9$ to $10^{-6}$ ohm-cm, with said resistive properties being responsive to environmental changes applied thereto; and
   c. at least two conductors inscribed on said first surface of said substrate, one of said conductors connected to said input end of said delineated pattern and another connected to said output end thereof, to thereby provide electrical connections to said thermoresistive sensor.

2. A device of claim 1, in which said monolithic wide-bandgap semiconductor compound substrate is of a material including selections from the group including Aluminum Nitride, Silicon Carbide, Boron Nitride, Gallium Nitride or diamond.

3. A device of claim 1, in which said laser is of a type selected from the group consisting of Nd:YAG, frequency doubled Nd:YAG or Excimer lasers.

4. A device of claim 1, in which said sensor device is a thermoresistive sensor device sensitive to thermal environmental changes.

5. A device of claim 1, in which said sensor device is a piezoresistive sensor device sensitive to pressure, tension or torsion environmental changes applied thereto.

6. A device of claim 1, in which said sensor device is a chemoresistive sensor device sensitive to chemical environmental changes applied thereto.

7. A circuit having a plurality of electronic components and devices inscribed insitu on a selected monolithic wide-bandgap semiconductor compound substrate directly by a laser beam, wherein the electronic components and devices are inherently compatible with the substrate upon which they reside, with respect to their respective thermal coefficients of expansion, exhibiting higher thermal conductivity and dielectric constant properties insitu, the combination comprising:
  a. a monolithic substrate of crystalline or polycrystalline wide-bandgap semiconductor compound material responsive to direct conversion by selected laser beams, the conversion ranging from an electrical insulator to an electrical semiconductor and/or electrical conductor;
  b. a plurality of electronic components and devices inscribed on surfaces of said substrate directly by a focussed laser beam impinging upon selected areas converting said areas to a plurality of devices such as electronic sensors, diodes, transistors and conductors in said selected areas of said substrate; and
  c. a plurality of conductors inscribed onto surfaces of said substrate interconnecting said plurality of components and devices in a selected circuit configuration to provide an operable electronic circuit.

8. An electronic circuit of claim 7, in which said laser is of a type selected from the group consisting of Nd:YAG, frequency doubled Nd:YAG or Excimer lasers, and said substrate is a wide-bandgap semiconductor compound of a material selected from the group including Aluminum Nitride, Silicon Carbide, Boron Nitride, Gallium Nitride and diamond.

9. A circuit having a plurality of electronic components and devices inscribed insitu on a selected wide-bandgap semiconductor compound film directly by a laser beam, wherein the electronic components and devices are inherently compatible with the film upon which they reside, with respect to their respective thermal coefficients of expansion, exhibiting higher thermal conductivity and dielectric constant properties insitu, the combination comprising:
  a. a film of crystalline or polycrystalline wide-bandgap semiconductor compound material disposed on a support substrate, said film being responsive to direct conversion by selected laser beams, the conversion ranging from an electrical insulator to an electrical semiconductor and/or electrical conductor;
  b. a plurality of electronic components and devices inscribed on said film directly by a focussed laser beam impinging upon selected areas converting said areas to a plurality of devices such as electronic sensors, diodes, transistors and conductors in said selected areas of said film; and
  c. a plurality of conductors inscribed onto surfaces of said film interconnecting said plurality of components and devices in a selected circuit configuration to provide an operable electronic circuit.

10. An electronic circuit of claim 9, in which said laser is of a type selected from the group consisting of Nd:YAG, frequency doubled Nd:YAG or Excimer lasers, and said film is a wide-bandgap semiconductor compound of a material selected from the group including Aluminum Nitride, Silicon Carbide, Boron Nitride, Gallium Nitride or diamond.

11. An electronic circuit of claim 9, in which successive film layers are stacked on one another each having devices and circuitry formed on each layer to produce a multi-layer three dimension integrated circuit structure.

* * * * *